(12) United States Patent
Lin

(10) Patent No.: US 10,506,727 B1
(45) Date of Patent: Dec. 10, 2019

(54) QUICK MOUNTING JUNCTION BOX FOR A CEILING FAN

(71) Applicant: Kuo-Tsun Lin, Taichung (TW)

(72) Inventor: Kuo-Tsun Lin, Taichung (TW)

( * ) Notice: Subject to any disclaimer, the term of this patent is extended or adjusted under 35 U.S.C. 154(b) by 0 days.

(21) Appl. No.: 16/421,753

(22) Filed: May 24, 2019

(30) Foreign Application Priority Data

Oct. 31, 2018 (CN) .......................... 2018 1 1284438

(51) Int. Cl.
| | | |
|---|---|---|
| *H05K 5/00* | (2006.01) |
| *H05K 7/00* | (2006.01) |
| *H01R 12/51* | (2011.01) |
| *H05K 1/18* | (2006.01) |
| *H02G 3/20* | (2006.01) |

(52) U.S. Cl.
CPC ......... *H05K 5/0069* (2013.01); *H01R 12/515* (2013.01); *H05K 1/18* (2013.01); *H02G 3/20* (2013.01); *H05K 2201/09018* (2013.01); *H05K 2201/09027* (2013.01); *H05K 2201/10015* (2013.01); *H05K 2201/10053* (2013.01); *H05K 2201/10189* (2013.01)

(58) Field of Classification Search
CPC ...................................................... H05K 5/00
See application file for complete search history.

(56) References Cited

U.S. PATENT DOCUMENTS

2017/0302190 A1* 10/2017 Ikarashi ................ H02M 7/493
2018/0102688 A1* 4/2018 Dhawan .............. F04D 25/0613

* cited by examiner

*Primary Examiner* — Jerry Wu
(74) *Attorney, Agent, or Firm* — Akerman LLP; Peter A. Chiabotti

(57) ABSTRACT

A quick mounting junction box for connecting a power source and a ceiling fan motor of a ceiling fan includes a circuit board having a mounting portion on which a start capacitor and a positive and reverse switch are disposed, and a power connecting portion and a motor connecting portion which are formed adjacent to a side edge and on which a power source connector and a motor connector are respectively disposed. The start capacitor and the positive and reverse switch are electrically connected with the power source connector and the motor connector through the circuit board. The power source and the ceiling fan motor can be easily assembled and connected through the power source connector and the motor connector.

6 Claims, 3 Drawing Sheets

QUICK MOUNTING JUNCTION BOX FOR A CEILING FAN

CROSS-REFERENCE TO RELATED APPLICATION

This application claims priority of Chinese Patent Application No. 201811284438.1, filed on Oct. 31, 2018.

FIELD

The disclosure relates to a ceiling fan, and more particularly to a quick mounting junction box for a ceiling fan.

BACKGROUND

Referring to FIG. 1, a conventional electric power system for a ceiling fan includes a start capacitor 13, a positive and reverse switch 14, and a plurality of closed-end wire connectors 15 to make connection among a power source 11, a ceiling fan motor 12, the start capacitor 13, and the positive and reverse switch 14. In assembly, the start capacitor 13, the closed-end wire connectors 15 and associated wires connecting therebetween are mounted in a distribution receptacle (not shown) for enhancing the outer appearance of the ceiling fan. However, the distribution receptacle is bulky with a large number of elements and wires received therein. Besides, a disadvantage of such arrangement using the closed-end wire connectors 15 is that wire loosening, bending and breaking occur and hence result in malfunction.

SUMMARY

Therefore, an object of the disclosure is to provide a quick mounting junction box for a ceiling fan that can alleviate at least one of the drawbacks of the prior art.

According to the disclosure, the quick mounting junction box for connecting a power source and a ceiling fan motor of a ceiling fan includes a circuit board, a power source connector, a motor connector and an electric unit. The circuit board includes a mounting portion which is formed on a major surface of the circuit board, and a power connecting portion and a motor connecting portion which are connected with the mounting portion and which are formed adjacent to a side edge of the major surface of the circuit board. The power source connector is disposed on the power connecting portion to be electrically connected with the power source. The motor connector is disposed on the motor connecting portion to be electrically connected with the ceiling fan motor. The electric unit includes a start capacitor which is disposed on the mounting portion and which is electrically connected with the power source connector and the motor connector through the circuit board, and a positive and reverse switch which is disposed on the mounting portion and spaced apart from the start capacitor, and which is electrically connected with the power source connector and the motor connector through the circuit board.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
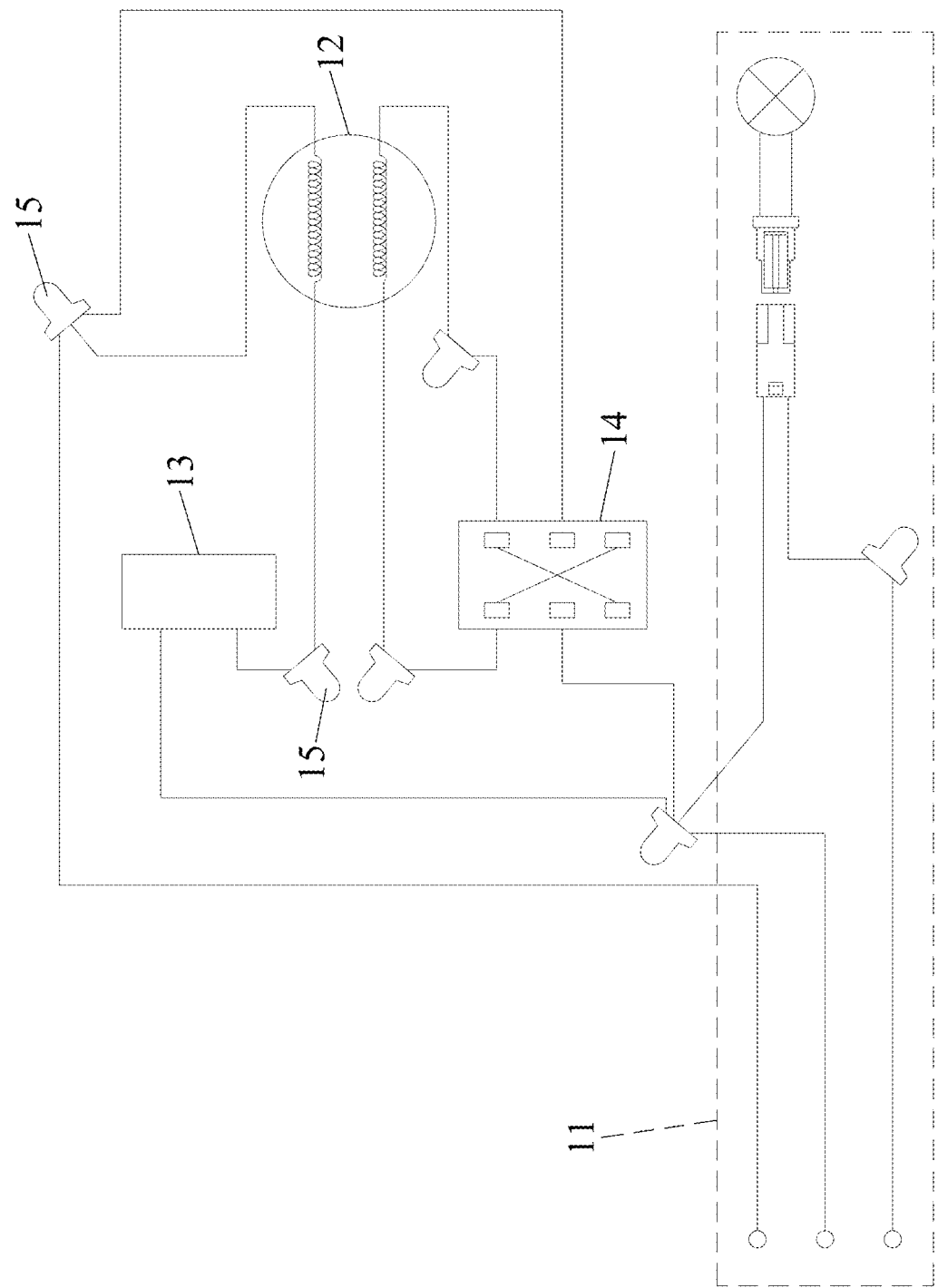
FIG. 1 is a schematic circuit diagram of a conventional electric power system for a ceiling fan.
Figure 2:
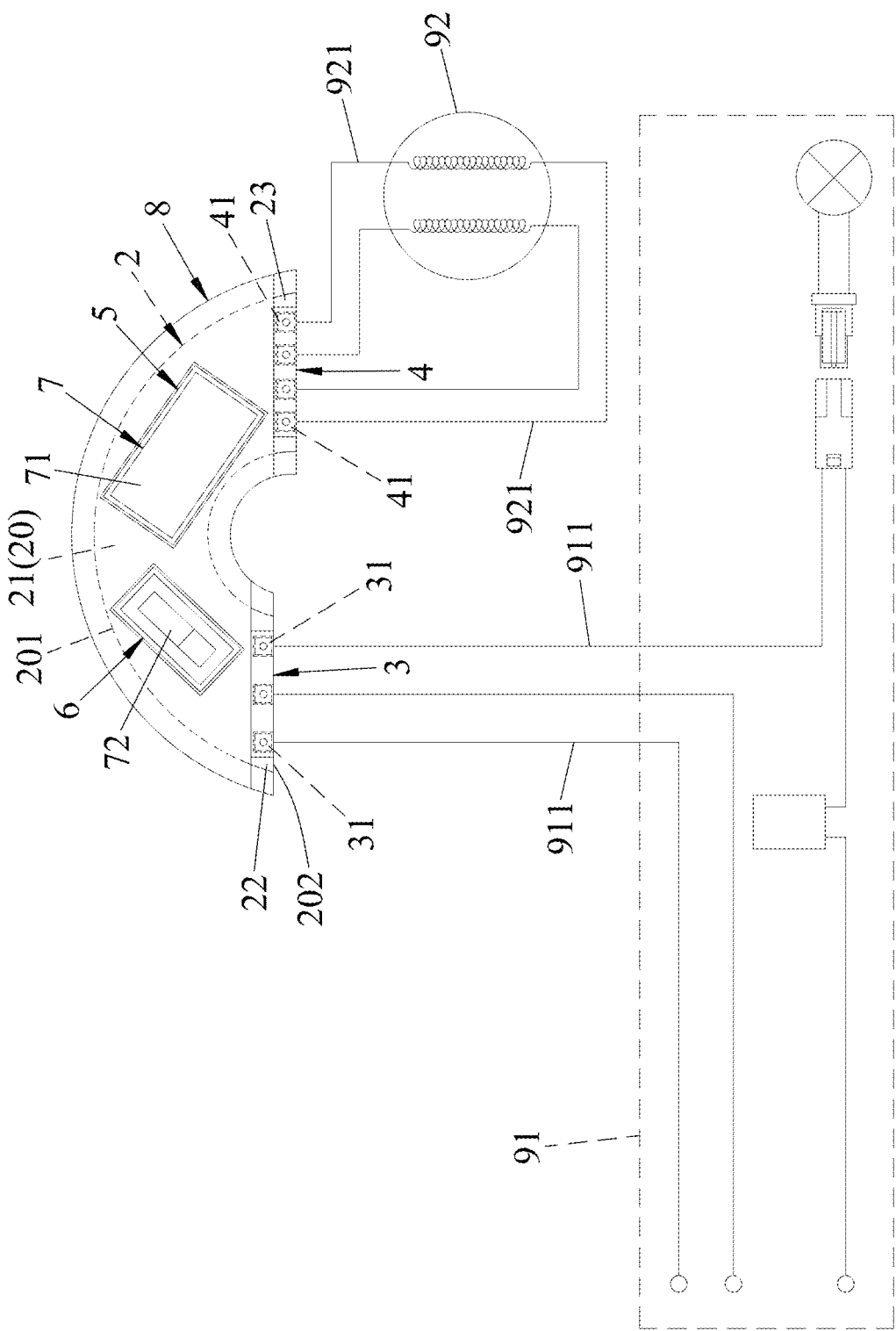
FIG. 2 is a schematic circuit diagram of an electric power system with an embodiment of a quick mounting junction box according to the disclosure.
Figure 3:
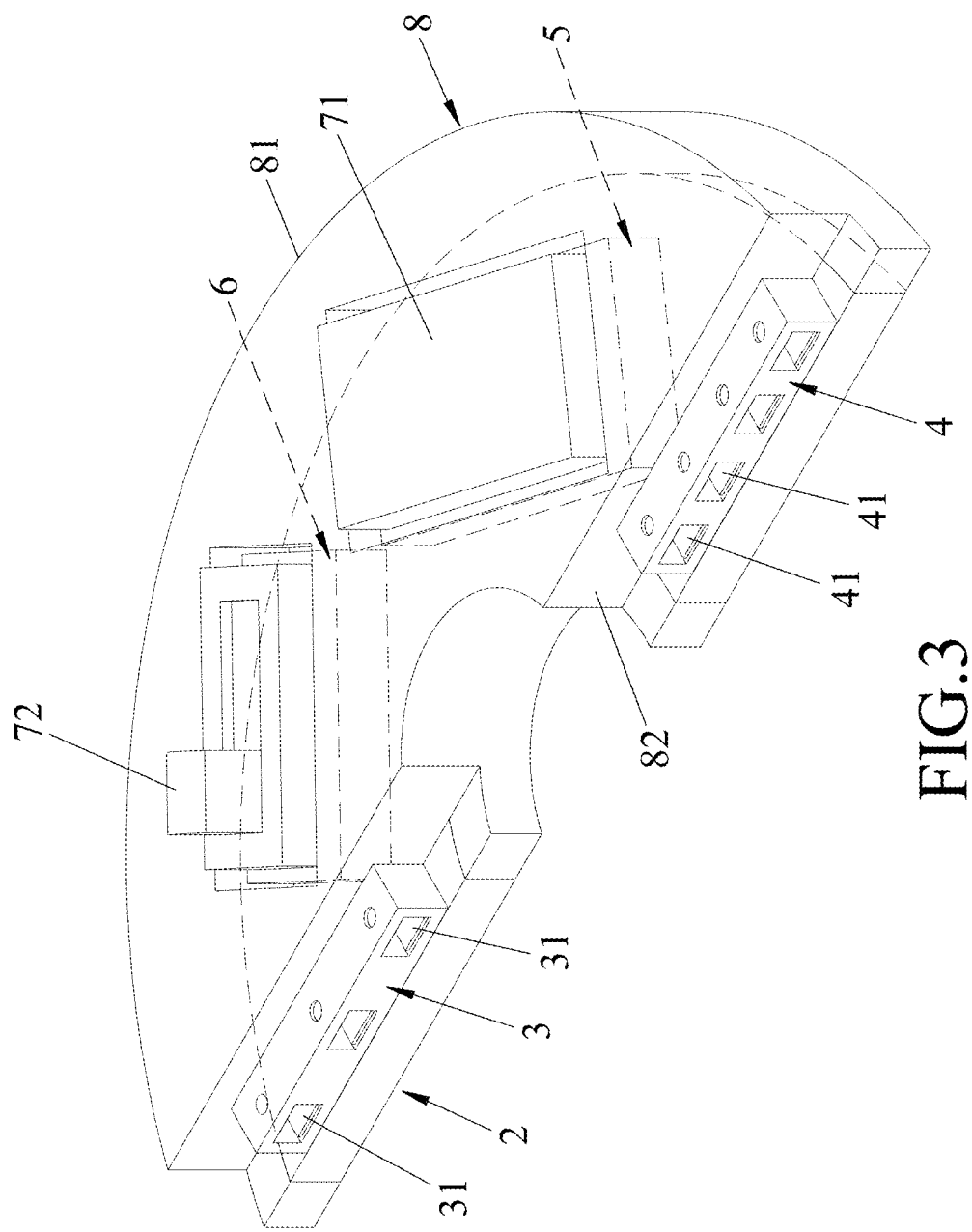
FIG. 3 is a perspective view of the embodiment.

Referring to FIGS. 2 and 3, the embodiment of a quick mounting junction box according to the disclosure is for connecting a power source 91 and a ceiling fan motor 92 of a ceiling fan. The power source 91 is provided with three wires 911. The ceiling fan motor 92 has four wires 921.

The quick mounting junction box of the embodiment includes a circuit board 2, a power source connector 3, a motor connector 4, a capacitor connector 5, a switch connector 6, an electric unit 7 and a housing shell 8.

The circuit board 2 includes a mounting portion 21 which is formed on a major surface 20 of the circuit board 2, and a power connecting portion 22 and a motor connecting portion 23 which are connected with the mounting portion 21 and which are formed adjacent to a side edge of the major surface 20 of the circuit board 2. In this embodiment, the major surface 20 of the circuit board 2 has an arcuate rim portion 201 having two ends, and a straight rim portion 202 interconnecting the ends of the arcuate rim portion 201 and serving as the side edge. The power connecting portion 22 and the motor connecting portion 23 are formed proximate to the ends of the arcuate rim portion 201, respectively, and are located at two opposite sides of the mounting portion 21.

The power source connector 3 is disposed on the power connecting portion 22 to be electrically connected with the power source 91. The power source connector 3 has three wire gripping jaws 31 electrically connected with the circuit board 2 and spaced apart from each other for gripping the electric wires 911 of the power source 91. The wire gripping jaws 31 are configured to permit adjustment of the distance between two adjacent ones of the wire gripping jaws 31.

The motor connector 4 is disposed on the motor connecting portion 23 to be electrically connected with the ceiling fan motor 92. The motor connector 4 has four wire gripping jaws 41 electrically connected with the circuit board 2 and spaced apart from each other for gripping the electric wires 921 of the ceiling fan motor 92. The wire gripping jaws 41 are configured to permit adjustment of the distance between two adjacent ones of the wire gripping jaws 41.

The capacitor connector 5 and the switch connector 6 are disposed on the mounting portion 21 and are spaced apart from each other.

The electric unit 7 includes a start capacitor 71 and a positive and reverse switch 72 mounted in the capacitor connector 5 and the switch connector 6, respectively, and electrically connected with the power source connector 3 and the motor connector 4 through the circuit board 2.

The housing shell 8 is disposed to enclose and accommodate the circuit board 2 therein such that the start capacitor 71, the positive and reverse switch 72, the power source connector 3 and the motor connector 4 are exposed from the housing shell 8. The housing shell 8 is configured to mate with the circuit board 2, and has an arcuate rim portion 81 having two ends, and a straight rim portion 82 interconnecting the ends of the arcuate rim portion 81 to cooperatively define an accommodation space for accommodating the circuit board 2. The power source connector 3 and the motor connector 4 extend outwardly of the housing shell 8 from the straight rim portion 82.

Since the structure and electric connection of the power source 91, the ceiling fan motor 92, the start capacitor 71 and the positive and reverse switch 72 are of a hitherto known type, a description thereof is dispensed with herein.

In assembly, the electric wires 911 of the power source 91 are inserted into the power source connector 3 and gripped by the wire gripping jaws 31, and the electric wires 921 of the ceiling fan motor 92 are inserted into the motor connector 4 and gripped by the wire gripping jaws 41, such that the electric connection among the power source 91, the ceiling fan motor 92, the start capacitor 71, and the positive and reverse switch 72 is established.

With the power source connector 3 and the motor connector 4 arranged to be spaced apart from each other, the positioning of the electric wires 911, 921 is convenient to conduct by an operator. In addition, with the wire gripping jaws 31, 41 respectively formed in the power source connector 3 and the motor connector 4, the electric wires 911, 921 are secured firmly and evenly as compared with the prior art using closed-end wire connectors that are liable to wire loosening, bending and breaking which result in malfunction. Furthermore, with the housing shell 8 having an arcuate structure, the junction box can be easily mounted on a central stem (not shown) of a ceiling fan, and can be reduced in size without the need to load additional wires therein.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A quick mounting junction box for connecting a power source and a ceiling fan motor of a ceiling fan, comprising:
   a circuit board including a mounting portion which is formed on a major surface of said circuit board, and a power connecting portion and a motor connecting portion which are connected with said mounting portion and which are formed adjacent to a side edge of said major surface of said circuit board;
   a power source connector disposed on said power connecting portion to be electrically connected with the power source;
   a motor connector disposed on said motor connecting portion to be electrically connected with the ceiling fan motor; and
   an electric unit including a start capacitor which is disposed on said mounting portion and which is electrically connected with said power source connector and said motor connector through said circuit board, and a positive and reverse switch which is disposed on said mounting portion and spaced apart from said start capacitor, and which is electrically connected with said power source connector and said motor connector through said circuit board.

2. The quick mounting junction box as claimed in claim 1, wherein said major surface of said circuit board has an arcuate rim portion having two ends, and a straight rim portion interconnecting said ends of said arcuate rim portion and serving as said side edge, said power connecting portion and said motor connecting portion being formed proximate to said ends of said arcuate rim portion, respectively, and located at two opposite sides of said mounting portion.

3. The quick mounting junction box as claimed in claim 1, further comprising a capacitor connector and a switch connector which are disposed on said mounting portion and spaced apart from each other, said start capacitor and said positive and reverse switch being mounted in said capacitor connector and said switch connector, respectively.

4. The quick mounting junction box as claimed in claim 1, wherein said power source connector has a plurality of wire gripping jaws electrically connected with said circuit board and spaced apart from each other, said motor connector having a plurality of wire gripping jaws electrically connected with said circuit board and spaced apart from each other.

5. The quick mounting junction box as claimed in claim 1, further comprising a housing shell disposed to enclose and accommodate said circuit board therein such that said start capacitor, said positive and reverse switch, said power source connector and said motor connector are exposed from said housing shell.

6. The quick mounting junction box as claimed in claim 5, wherein said housing shell has an arcuate rim portion having two ends, and a straight rim portion interconnecting said ends of said arcuate rim portion to cooperatively define an accommodation space for accommodating said circuit board, said power source connector and said motor connector extending outwardly of said housing shell from said straight rim portion.

* * * * *